US 11,508,594 B2

(12) United States Patent
Chiu et al.

(10) Patent No.: US 11,508,594 B2
(45) Date of Patent: Nov. 22, 2022

(54) SUBSTRATE CONTAINER SYSTEM

(71) Applicant: GUDENG PRECISION INDUSTRIAL CO., LTD, New Taipei (TW)

(72) Inventors: Ming-Chien Chiu, New Taipei (TW); Chih-Ming Lin, New Taipei (TW); Cheng-En Chung, New Taipei (TW); Nien-Yun Yu, New Taipei (TW); Po-Ting Lee, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 337 days.

(21) Appl. No.: 16/872,392

(22) Filed: May 12, 2020

(65) Prior Publication Data
US 2021/0013076 A1  Jan. 14, 2021

(30) Foreign Application Priority Data

Jul. 13, 2019 (TW) .................................. 108124813

(51) Int. Cl.
*H01L 21/673* (2006.01)
*H01L 21/677* (2006.01)
*H01L 21/67* (2006.01)

(52) U.S. Cl.
CPC .. *H01L 21/67393* (2013.01); *H01L 21/67017* (2013.01); *H01L 21/67126* (2013.01); *H01L 21/67373* (2013.01); *H01L 21/67376* (2013.01); *H01L 21/67386* (2013.01); *H01L 21/67766* (2013.01); *H01L 21/67769* (2013.01); *H01L 21/67772* (2013.01)

(58) Field of Classification Search
CPC ..................... H01L 21/67393; H01L 21/67376
See application file for complete search history.

(56) References Cited

U.S. PATENT DOCUMENTS

| 8,794,444 B2 * | 8/2014 | Sheng ............... H01L 21/67386 |
| | | 206/454 |
| 2011/0139675 A1 | 6/2011 | Ku et al. |
| 2015/0348810 A1 | 12/2015 | Burns et al. |
| 2015/0357218 A1 | 12/2015 | Lin et al. |
| 2017/0049284 A1 | 2/2017 | Wang et al. |

(Continued)

FOREIGN PATENT DOCUMENTS

| CN | 1749118 A | 3/2006 |
| JP | 2011514014 A | 4/2011 |

(Continued)

*Primary Examiner* — Saul Rodriguez
*Assistant Examiner* — Willie Berry, Jr.
(74) *Attorney, Agent, or Firm* — ScienBiziP, P.C.

(57) ABSTRACT

A substrate container system comprises a container body having a bottom face, a front opening that enables passage of a substrate, and a back opening opposing the front opening, the back opening having a width smaller than that of the front opening; and a back cover that covers the back opening and establishes sealing engagement with the container body, wherein the back cover comprises a first gas inlet structure that bendingly extends under the bottom face of the container body upon assembly; wherein the first gas inlet structure comprises a downward facing gas intake port opposing the bottom face of the container body.

20 Claims, 16 Drawing Sheets

(56) References Cited

U.S. PATENT DOCUMENTS

2017/0213752 A1     7/2017  Ogawa et al.
2018/0308733 A1*  10/2018  Kasama ............... B01D 46/526

FOREIGN PATENT DOCUMENTS

| JP | 2015-162531 A | 9/2015 |
| --- | --- | --- |
| JP | 2016012662 A | 1/2016 |
| JP | 2019102497 A | 6/2019 |
| KR | 1020100134033 A | 12/2010 |
| TW | 201136814 A1 | 11/2011 |
| TW | M489155 U | 11/2014 |
| TW | 201622047 A | 6/2016 |
| TW | 201704119 A | 2/2017 |
| TW | 201802006 A | 1/2018 |
| TW | M563421 U | 7/2018 |
| WO | 2017111451 A1 | 6/2017 |
| WO | 20180203524 A1 | 11/2018 |

\* cited by examiner

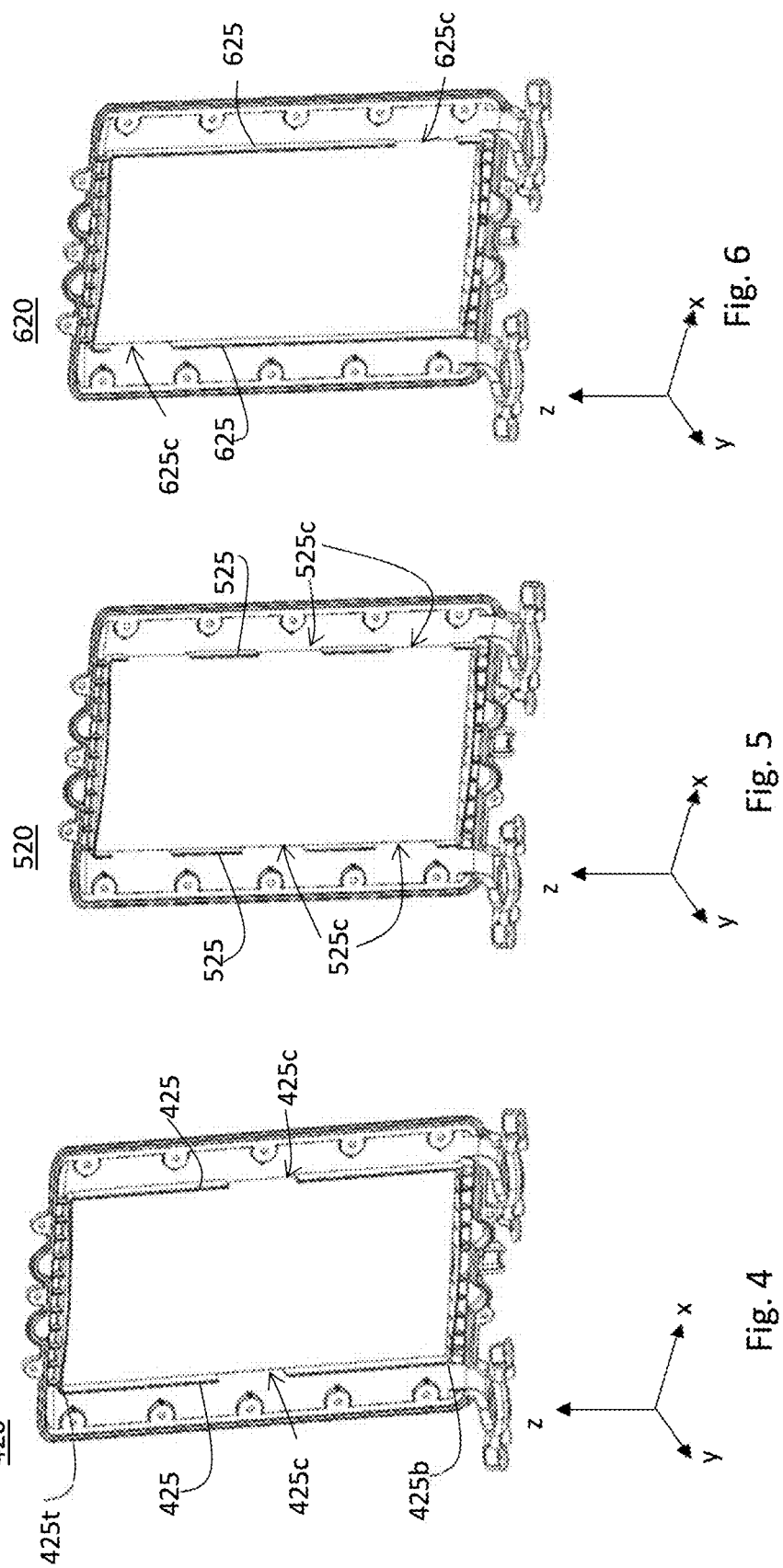

SUBSTRATE CONTAINER SYSTEM

CROSS-REFERENCE TO RELATED APPLICATIONS

This application claims the benefit of Taiwan Application No. 108124813 filed on Jul. 13, 2019, which is hereby incorporated by reference herein and made a part of specification.

FIELD

This present disclosure relates to transportable container suitable for keeping delicate objects, e.g., a wafer, from environmental contamination during storage, transport, and shipment, and, in particular, to container system capable of evenly distributing purging gas within the container system.

BACKGROUND

Delicate work pieces (e.g., wafers, photo mask/reticles) are subjected to numerous fabrication steps through multiple processing equipment during modern semiconductor manufacturing processes before integrated circuits can be manufactured. The wafers are often transported or shipped from a wafer manufacturing facility to another site where they are further processed. The relocation of such delicate devices is often done through dedicated substrate containers, such as FOUPs (front opening unified pods).

Front opening unified pods (FOUPs) are often used for containing 300 mm or 450 mm wafers between processing stations. FOUPs conventionally have a shell that defines an open interior and shelves in the shell for holding a spaced stack of wafers. Moreover, the shell defines a front opening that is coverable by a front door member, which incorporates a sealing member and a latch mechanism to establish hermetical engagement between the door and the shell.

It is desirable to control the intrusion of ambient contaminant (e.g., air/dust/moisture) into the substrate container during the insertion or removal of substrates (e.g., when the front door is removed and the interior is exposed). The intrusion of ambient contaminant into the pod can adversely affect the yield of the resident substrates, even when the ambient environment is that of a clean room. To this end, purging equipment is incorporated into the carrying pod system to support a purging process during loading/unloading of the pod payload.

BRIEF DESCRIPTION OF DRAWINGS

The invention can be more fully understood by reading the following detailed description of the embodiment, with reference made to the accompanying drawings as follows:

FIGS. 4 to 6 respectively illustrates an isometric view of a back cover of a substrate container system in accordance with some embodiments of the instant disclosure;

FIG. 7b illustrates an enlarged regional view of FIG. 7a;

Figure 1:
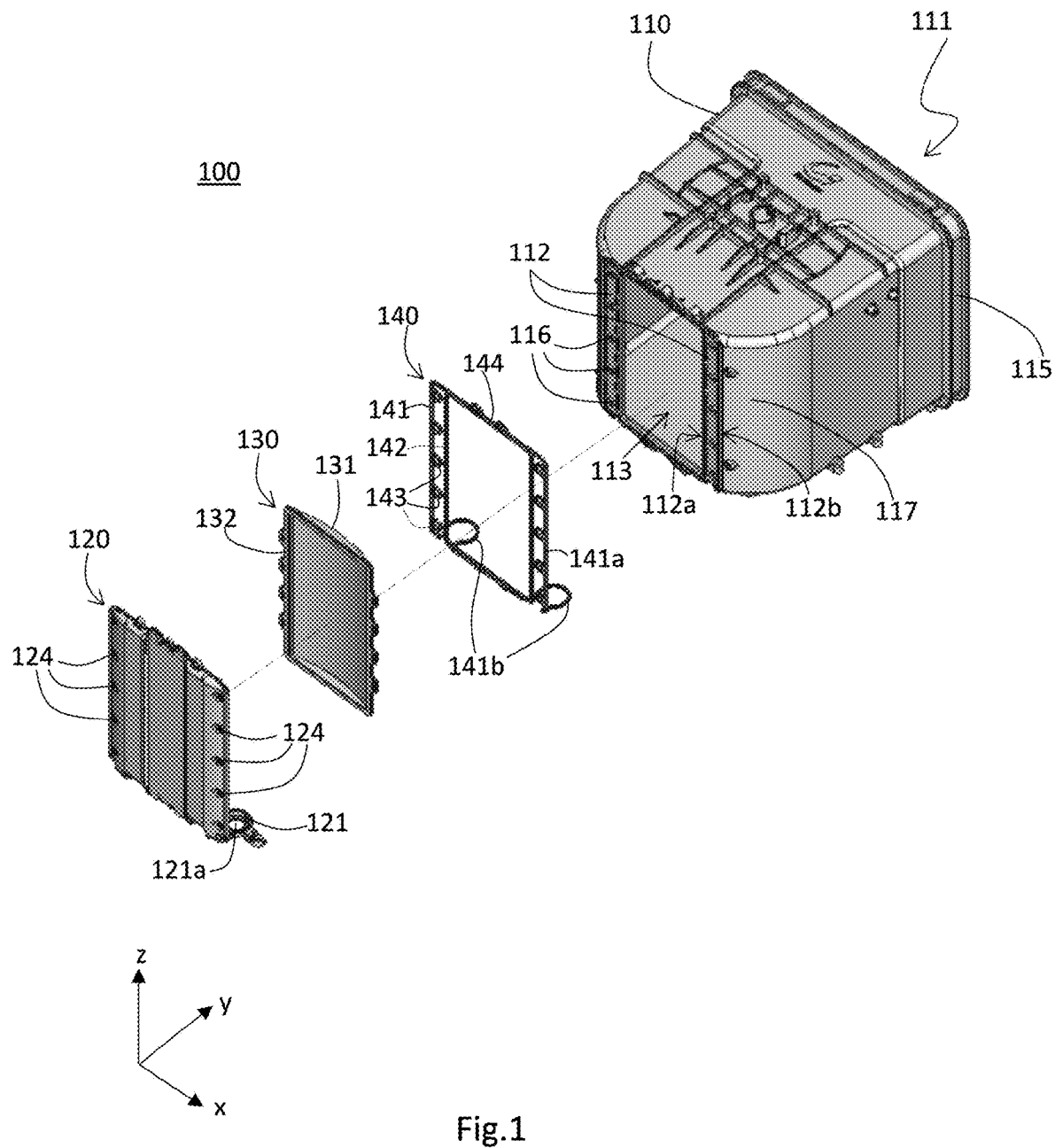
FIG. 1 illustrates an isometric view of a substrate container system in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 18. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates an isometric view of a substrate container system 100 in accordance with some embodiments of the instant disclosure. For illustrational simplicity and clarity, some detail/subcomponents of the exemplary system are not explicitly labeled/shown in the instant figure. In some embodiments, the substrate container system comprises a front opening unified pod (FOUP). The exemplary container system 100 defines a front opening 111 (obstructed from current view) that enables passage of substrates (e.g., wafers, reticles, or other semiconductor fabrication related work piece). In some embodiments, the front opening may be wider than a substrate. In the illustrated embodiment, substrate container system 100 includes a container body 110 suitable for housing substrates and a back cover 120 configured to enclose the back of the container body 110. In some embodiments, the container body is a unitary member formed as an integral one-piece structure, e.g., by technique such as injection molding. The container body 100 further defines a back opening 113 opposing the front opening, which can be covered (and eventually sealed) by the back cover 120. The back opening is provided to allow purged gas flow into the interior of the container body. As shown in the exemplary embodiment, the back opening 113 has a width (e.g., in the x-axis direction) smaller than that of the front opening 111. For instance, the container body 110 of the illustrated embodiment includes a front flange 115 proximate its frontal face (on which the front opening 111 is formed), which give the container body 100 a general outer profile that gradually widens toward the front port (e.g., opening 111) thereof. In the exemplary figure, the wider frontal face of the container body 110 accommodates a wider front opening 111 compared to the narrower opposing back opening 113.

In some embodiments, the container body 110 is configured to receive a filter element (e.g., filter member 130) at the back face thereof configured to cover the back opening 113. For example, the container body 110 further comprises a pair of flange portions 112 capable of receiving a filter member 130. In the exemplary embodiment, the flange portions 112 are respectively arranged adjacent to the back opening 113 along a width direction (e.g., x-direction indicated in FIG. 1) of the back cover 120 (e.g., extending toward the center of the back opening 113 from the two side walls 117 of the container body 110). Specifically, the inner fringes 112a of the flange portions 112 cooperatively define the back opening 113, and are configured to provide physical support for the received filter member 130 such that the filter member 130 may be evenly retained. Meanwhile, the filter member 130 in the illustrated embodiment comprises a filter plate 131 and an annular frame 132 that encircles the filter plate 131, which is provided with a sufficient planar dimension to cover the back opening 113. In the illustrated embodiment, the annular frame 132 is configured to establish sealing engagement with the inner fringe 112a of the flange portions 112 upon assembly. In some embodiments, the filter member (e.g., filter 130) includes a porous material. In some embodiments, the filter member may be integrally formed from a porous sintered material. In some embodiments, the porous sintered material may be manufactured by sintering granular materials. Suitable materials may include ceramic materials and polymer based materials, such as High-density polyethylene (HDPE), Polytetrafluoroethylene (PTFE), Ultra-high molecular weight polyethylene (UHMW), Nylon 6 (N6), Polypropylene (PP), Polyvinylidene fluoride (PVDF), Polyethersulfone (PES) and a combination thereof.

In some embodiments, the main body (e.g., container body 110) is configured to engage the back cover to enclose the back opening and the filter member. In the exemplary embodiment, the back cover 120 comprises a generally planar body configured to be mounted over the flange portions 112 at the back face of the container body 110. For instance, the laterally symmetrical flange portions 112 may be provided with a plurality of fastening members 116 (e.g., threaded holes) that correspond to a plurality of fastening pieces 124 (e.g., screws). As such, the back cover 120 may be coupled to container body 110 through the fasteners (e.g., 124) on flange portions 112. In some embodiments (such as the one shown in FIG. 17), the fastening mechanisms (e.g., member 116) may be arranged on other locations (e.g., side walls) of the container body 110 (e.g., at locations proximate the flange portions). For instance, in some embodiments, the fastening mechanisms may be arranged on a side wall 117 of the container body 110 rather than on the back face thereof.

In some embodiments, the back cover 120 comprises at least one gas inlet structure 121 configured to engage an external purging apparatus, thereby enabling the receipt of purging gas into the interior of the container system. In some embodiments, the gas inlet structure 121 maybe integrally constructed as an extended portion of the back cover 120 (e.g., extending from the planar portion of the back cover 120 that covers the filter member). In the illustrated embodiment, the gas inlet structure 121 comprises a gas intake port (e.g., downward facing port 121a) for connecting the purging apparatus.

The system 100 may further comprise a sealing member (e.g., member 140) configured to sustain a predetermined level of air-tightness between the back cover 120 and the container body 110. In some embodiments, the sealing member (e.g., member 140) incorporates a double loop configuration and is to be arranged between the back cover 120 and the container body 110. For instance, the exemplary sealing member 140 is shown to include a first (outer) seal ring portion 141 configured to be arranged between the back cover 120 and the container body 110. In the illustrated embodiment, the shape of the first seal ring portion 141 is shown to correspond to an outer fringe region 112b of the flange portions 112 and is configured to establish the sealing engagement along the outer fringe region 112b of the flange portions 112. In some embodiments, the first seal ring portion 141 may be further provided with a section configured to enhance the sealing engagement between the gas inlet structure (e.g., inlet 121) and the container body (e.g., body 110). For instance, the first seal ring portion 141 may be provided with a bending loop section that extends between the bottom face of the container body 110 and the gas inlet structures 121 upon assembly (e.g., that bends substantially 90 degrees from the plane defined by the back cover 120) to maintain gas sealing around the intake port (e.g., port 121a). In the illustrated embodiment, the first seal ring portion 140 comprises a main section 141a and two bended sections 141b that bends from the main section 141a (e.g., corresponding to the pair of downward facing intake ports 121a).

In some embodiments, the sealing member (e.g., member 140) may be configured to enable sealing between the filter member (e.g., member 130) and the container body (e.g., body 110). For instance, the sealing member 140 shown in the instant figure further comprises a second (inner) seal ring portion 142 configured to be seated between the filter member 130 and the container body 110. In some embodiments, the first and second ring portions 141,142 are integrally connected (e.g., integrally formed as a unitary gasket member through, e.g., a same molding process). In the illustrated embodiment, the first and the second seal ring portions 141, 142 share a same common section 144. In some embodiments, the second ring portion may be a separate component that is not integrally connected to the first ring portion. In the illustrated embodiment, the sealing member 140 further comprises a plurality of third seal ring portions 143 configured to be seated around the fastening members (e.g. members 116, 124) to ensure sealing engagement at the jointing region between the main body (e.g., body 110) and the back plate (e.g., cover 120). In some embodiments, the first and third ring portions are integrally connected.

Figure 2:
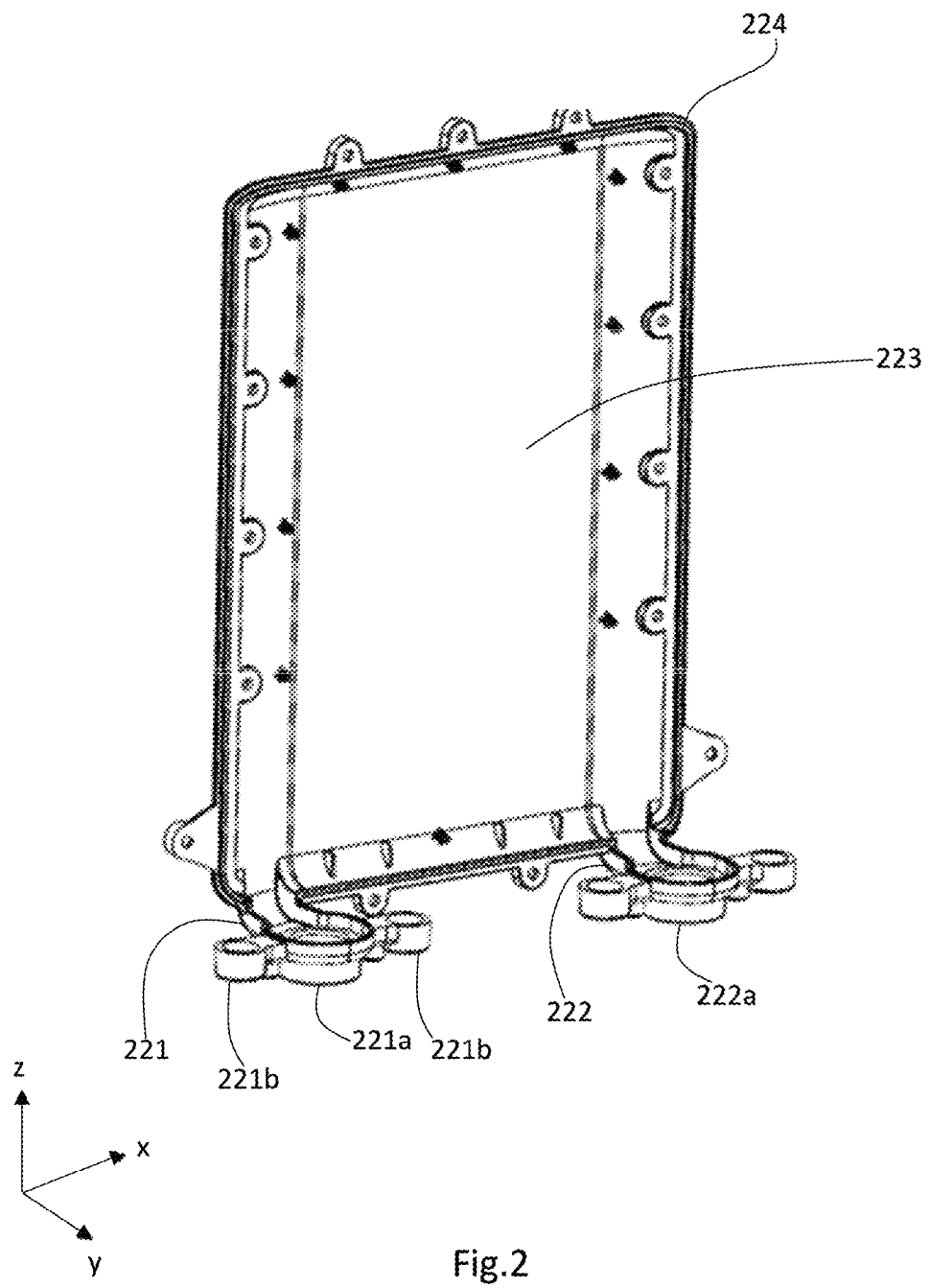
FIG. 2 illustrates an isometric view of a back cover for a substrate container system in accordance with some embodiments of the instant disclosure.

FIG. 2 illustrates an isometric view of a back cover for a substrate container system in accordance with some embodiments of the instant disclosure. In the illustrated embodiment, back cover 220 comprises a pair of inlet structures. By way of example, the exemplary back cover 220 are provided with a first gas inlet structure 221 and a second gas inlet structure 222, each having a downward facing gas intake port 221a/222a. The first and the second gas inlet structures 221, 222 are substantially symmetrically arranged along a width direction (e.g., x direction indicated in FIG. 2) of the back cover 220.

The back cover 220 comprises an inner face 223 oriented toward the container body (e.g., container body 110) upon assembly. In some embodiments, the back cover 220 covers the back opening of the container body and establishes sealing engagement with the container body upon assembly. For example, in the illustrated embodiment, a sealing lip 224 is formed at the periphery of the inner face 223 for directly contacting an outer sealing ring of a sealing member (e.g., the first seal ring portion 141) upon assembly.

In some embodiments, the gas intake structure may further comprise at least one guiding portion configured to guide the gas intake port to a correct position/orientation over the bottom face of the container body (e.g., body 110), thereby ensuring alignment between the onboard gas intake port (e.g., ports 221a/222a) and a gas outlet port of an external purging apparatus during docking. For example, the illustrated gas intake structure 221 is provided with a pair of guiding portions 221b (e.g., having an annular/ring profile) arranged neighboring the port 221a.

Figure 3:
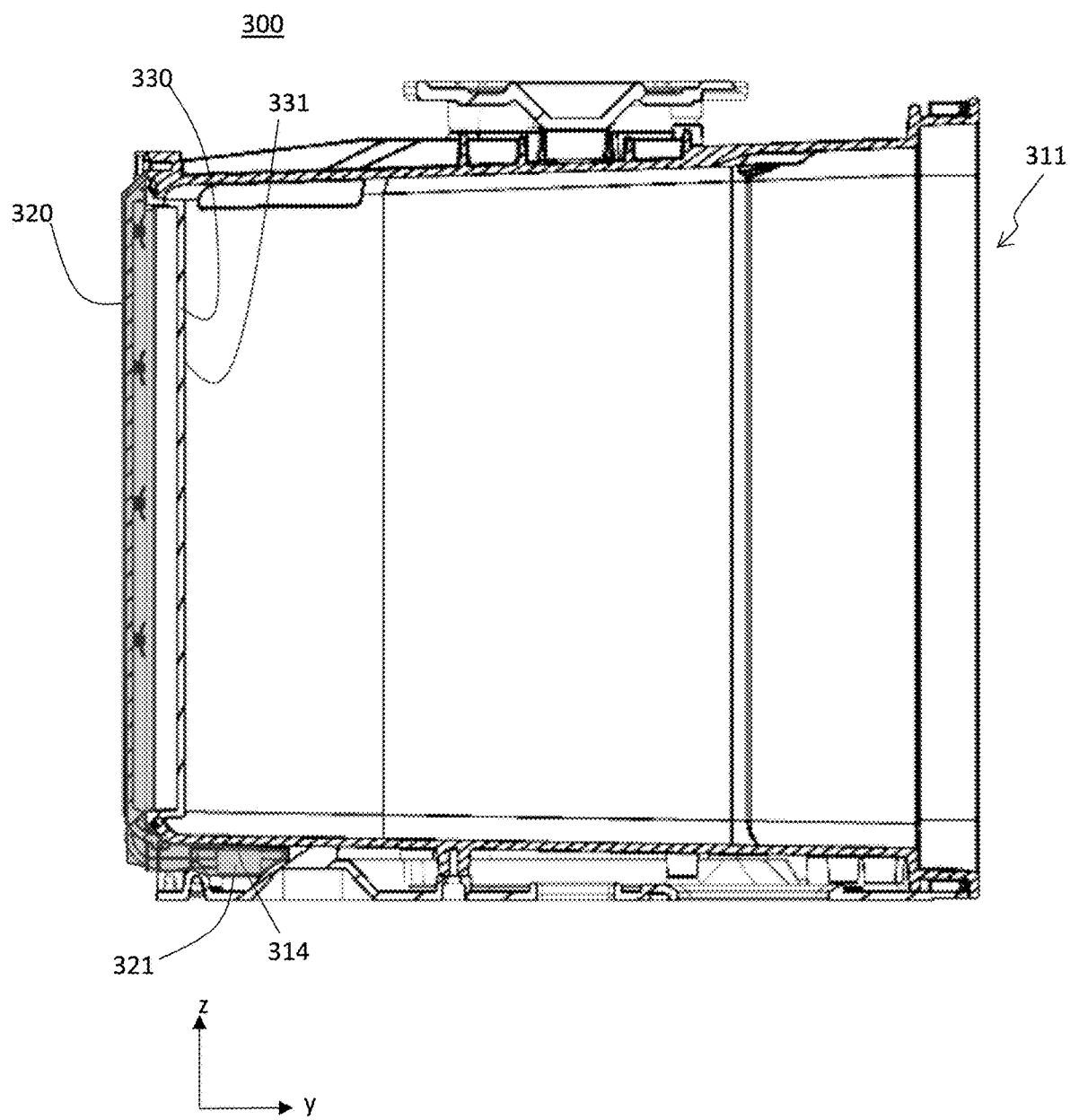
FIG. 3 illustrates a cross-sectional view of a substrate container system in accordance with some embodiments of the instant disclosure.

FIG. 3 illustrates a cross-sectional view of a substrate container system 300 in accordance with some embodiments of the instant disclosure. For instance, the illustrated cross section may reflect a cut-away view taken, e.g., in the y-z plane as illustrated in FIG. 1.

As shown in FIG. 3, the container body 310 has a bottom face 314. Upon assembly, the intake structure (e.g., gas intake structure 321) of the back cover 320 (shown by a darker shading tone for ease of recognition) bendingly extends under the bottom face 314. The gas intake port 321a is configured to face a direction opposing the bottom face 314 of the container body 310.

The container body 310 further defines a front opening 311 and a back opening (e.g., 112) opposing the front opening 311. The front opening 311 is shaped and sized to enable passage of the container payload (e.g. substrates). In some embodiments, the assembled filter member 330 has a gas dispensing surface 331 that is provided with a curved profile (e.g., depicted more clearly in FIG. 9b and FIG. 13). In some embodiments, the curved gas dispensing face (e.g., face 331) is configured to extend toward the container body 310 through the back opening (e.g., back opening 113).

In some operational scenarios, purged gas may be provided to the interior of system 100 via the gas intake port 321a, then pass through the filter member 330, then expelled out of the system 300 through extraction hole (e.g., extraction holes 714a illustrated in FIG. 7) formed in the bottom face 314.

FIG. 4 shows an exemplary back cover for a substrate container system in an isometric view in accordance with some embodiments of the instant disclosure. The exemplary back cover 420 is further provided with a pair of partition structures 425 extending along the height direction (e.g., the z-direction).

The partition structure 425 may form a gas guiding channel that extend along the height direction (e.g., the z-direction) of the back cover 420 and in fluid communication with the downward facing inlet structures (e.g., gas inlet structures 221/222). For example, upon assembly, the partition structures 425 of the back cover 420 are respectively oriented adjacent the back opening (e.g., 313) in the width direction (e.g., the x-direction) of the back cover 420, and is further arranged in contact with the filter member (e.g., along the filter frame 132 and over the inner fringe region 112a of the flange portions 112 in FIG. 1). Meanwhile, the back cover 420 at least partially overlaps the pair of the flange portions (e.g., flange portions 112 in FIG. 1) of the container body.

Sealing engagement between the exemplary back cover 420 and the main body (e.g., container body 110) may be established along the outer fringe regions (e.g., 112b) of the flange portions. In some embodiments, a pair of gas guiding channels from the gas inlet structures (e.g., 221/222) may be formed in the overlapped regions between the back cover 420 and the flange portions (e.g., 112) of the container body. As such, the flange portions (e.g., 112) are entirely covered by the back cover 420, whereby the gas guiding channel may have a width substantially equal to that of the flange portion (e.g., 112).

The back cover 420 and a filter member (e.g., filter member 130) may cooperatively form a buffering compartment connected to gas guiding channel via an outlet (e.g., 425c, which will be described in further detail below). For example, the pair of partition structures 425 laterally separates the back cover 420 into three regions. The region between the partition structures 425 of the back cover 420 and a back surface of a filter member (e.g., filter member 130) may cooperatively form a buffering compartment.

In the instant embodiment, purging gas may be provided into the buffering compartment from the gas intake port (e.g., 221a) through gas outlet 425c arranged at a middle section of the gas guiding channel (e.g., along the height/z-axis direction). The sintered porous structure in a filter member (e.g., member 130) helps to regulate gas flow there-through, thus maintains pressure inside the buffering compartment at a stable value during the purging operation. For instance, the filter member would allow passage of gas flow there-through when the pressure of the intake gas (e.g., from the intake port 221a/222a) reaches a certain threshold. As sufficient internal pressure builds up in the buffering compartment (e.g., the chamber formed between the back cover 120 and the filter member 130), the filter member would evenly distribute the purge gas into the interior of the main body (e.g., body 110) in an regulated manner.

In the exemplary embodiment, each of the partition structures 425 is provided with an outlet 425c substantially at the middle of the height of the back cover 420. In the exemplary embodiment, the outlet 425c is arranged substantially midway between a top end 425t and a bottom end 425b of the partition structure 425 (relative to the center of the outlet 425c).

FIGS. 5 and 6 respectively show isometric illustration of exemplary back covers for a substrate container system in an isometric view in accordance with some embodiments of the instant disclosure.

Referring to FIG. 5, each of the partition structures 525 of the exemplary back cover 520 has three outlets 525c provided therein. The outlets 525c in the opposing partition structures 525 are formed substantially in a lateral symmetrical manner (e.g., along the x-axis direction).

Referring to FIG. 6, each of the partition structures 625 of the exemplary back cover 620 is provided with one outlet 625c. However, the outlets 625c are designed in a substantially non-symmetrical lateral arrangement (e.g., along the x-axis direction). For instance, the outlets 625c are respectively formed at a top and a bottom location along the height of the back cover 620 (e.g., along the z-axis).

It is found that the outlet configuration (e.g., location and number) may affect gas flow distribution in the container body (e.g., body 110). Moreover, proper placement of the gas outlet may facilitate reduction of intrusion of ambient air into the interior of the container body during purged loading/unloading operations. In some operational scenarios, purging gas may be symmetrically introduced into the buffering compartment through the two outlets 425c (e.g., arranged substantially at the middle of the height of the back cover 420) to the geometry center of the back cover 420. It is found that such configuration helps to alleviate the intrusion of ambient air in the front door removal process during loading/unloading of payload into/out of the container interior.

Figure 7A:
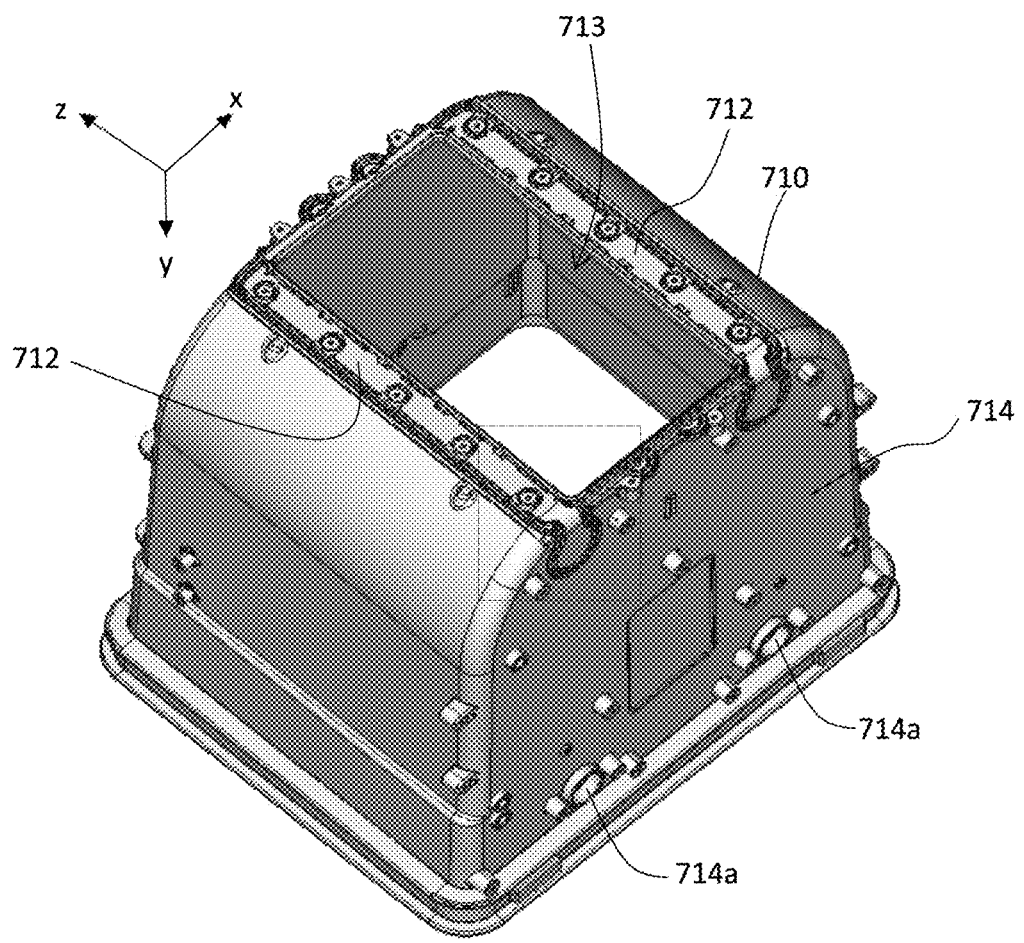
FIG. 7a illustrates an isometric view of a container body for a substrate container system in accordance with some embodiments of the instant disclosure.
Figure 7B:
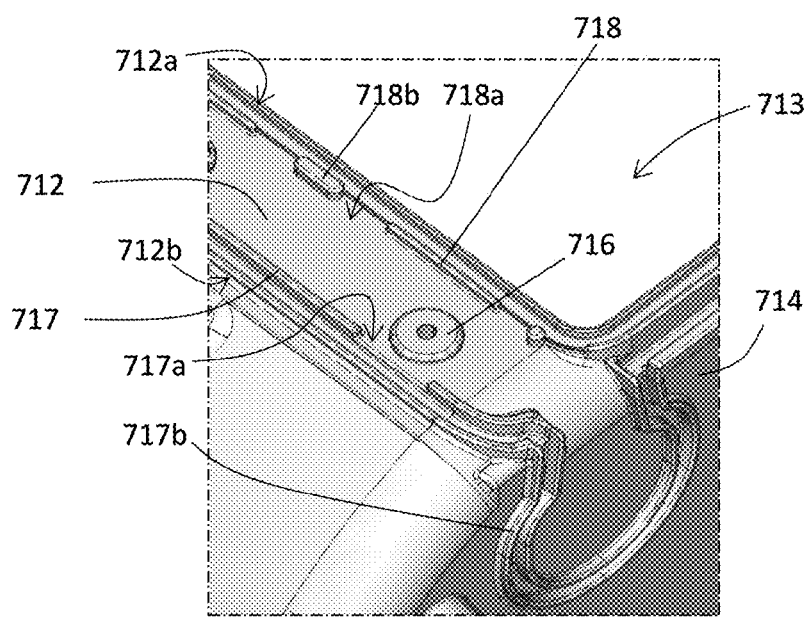

FIG. 7a illustrates an isometric view of a sealing member seating arrangement (e.g., for a sealing member 140/840 shown in FIGS. 1 and 8, respectively) for a substrate container system in accordance with some embodiments of the instant disclosure. FIG. 7b illustrates an enlarged regional view of FIG. 7a.

In the illustrated embodiment, a first groove structure (e.g., outer groove 717) is arranged along the outer periphery (e.g., region 712b) of the pair of flange potions of the container body (e.g., flange 712), while a second groove structure (e.g., inner groove 718) is arranged along the inner fringe 712a of the flange potion(s) 712. For instance, the exemplary container body 710 includes a first (outer) annular groove structure 717 that forms an annular loop that accommodates an outer seal ring (e.g., the first seal ring portion 141).

In some embodiments, the inner periphery of the first annular groove structure 717 is further provided with a plurality of gaps 717a positioned in correspondence with the location of the fastening members 716, thereby allowing additional seal ring(s) (e.g., third seal ring portions 143) to be arranged surround the respective fastening member 716.

In the illustrated embodiment, the first groove structure 717 further includes a bottom section 717b that defines a partially enclosed loop pattern over the bottom face 714 (as shown in FIG. 7b). In addition, the bottom face 714 is provided with a pair of exhaust ports (e.g., through holes 714a). On the other hand, the bottom face 714 is not provided with through holes at the location of the enclosed loop pattern region (of the bottom section 717b). Accordingly, a bended section (e.g., sections 141b) of an outer seal ring (e.g., seal ring 140) may be positioned in the bottom sections 717b of the first groove structure 717, whereby, the bended sections (e.g., sections 141b) of seal ring may be retained under the bottom face 714 of the container body 710.

The container body 710 further includes a second (inner) groove structure 718 that surrounds the back opening 713, configured to accommodate an inner seal ring (e.g., the second seal ring portion 142). Such arrangement enables the filter member (e.g., filter member 130) to establishes a sealing engagement with the container body 710 surrounding the back opening 713 upon assembling.

In some embodiments, the second groove structure 718 may be further provided with a plurality of gaps 718a and a plurality of pillars 718b arranged respectively in the gaps 718a for filter element (e.g., filter member 130) positioning/retention purposes.

Figure 7C:
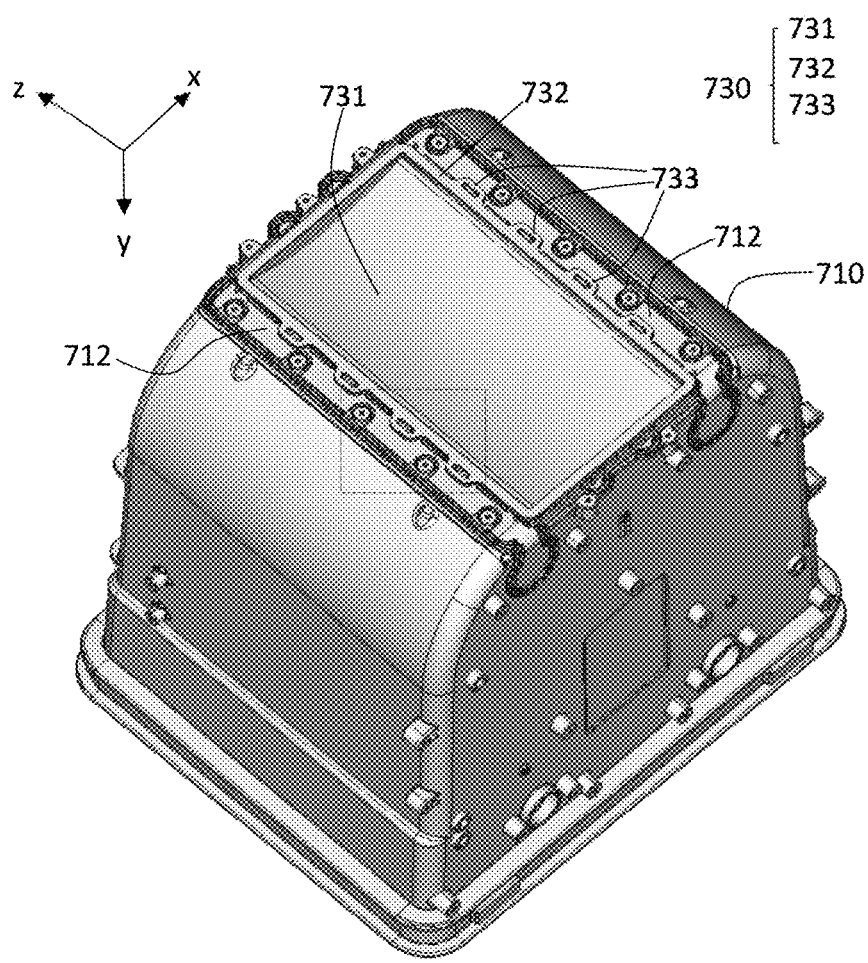
FIG. 7c illustrates an isometric view of a filter member arranged on a substrate container system in accordance with some embodiments of the instant disclosure.
Figure 7D:
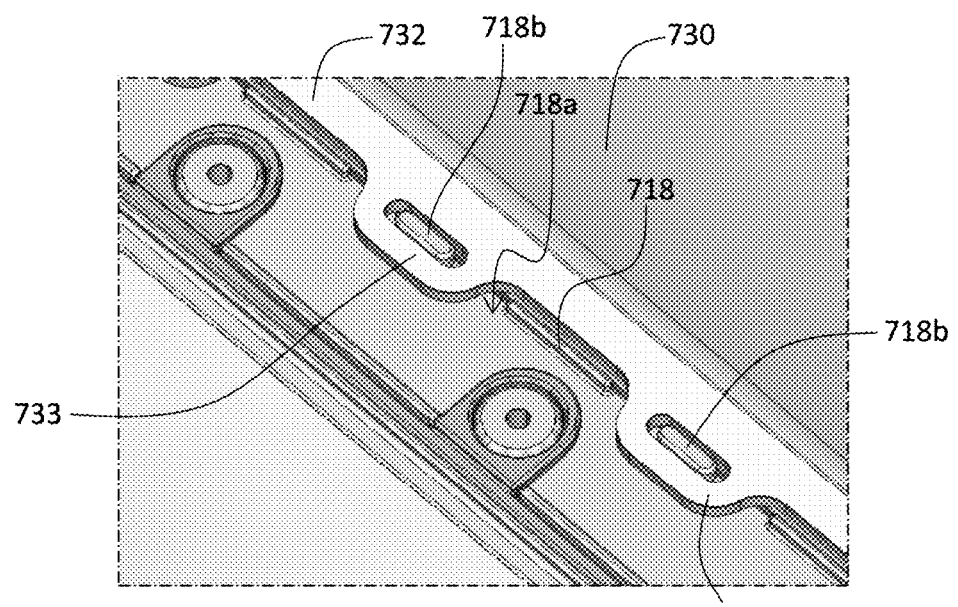
FIG. 7d illustrates an enlarged regional view FIG. 7c.

FIG. 7c illustrates an isometric view of a filter member 730 adapted on a substrate container system in accordance with some embodiments of the instant disclosure. FIG. 7d illustrates an enlarged regional view of FIG. 7c.

The exemplary filter member 730 includes a filter plate 731 and an annular frame 732. In some embodiments, the filter member 730 is further provided with a plurality of anchor rings 733 that extends outwardly from the annular frame 732. The anchor rings 733 may be symmetrically arranged along a width direction (e.g., the x-direction) of the filter member 730. Upon assembly, the annular frame 732 may physically contact an inner seal ring (e.g., second sealing ring portion 142) there-under, while the anchor rings 733 may engage the pillars 718b through the gaps 718a in the second groove structure 718. Such arrangement may restrain lateral movement of the filter member 730 upon assembly, thereby further ensuring sealing engagement between the annular frame 732 and the container body 710. In some embodiments, the anchor rings 733 are integrally formed with the annular frame 732 of the filter member 730.

Figure 7E:
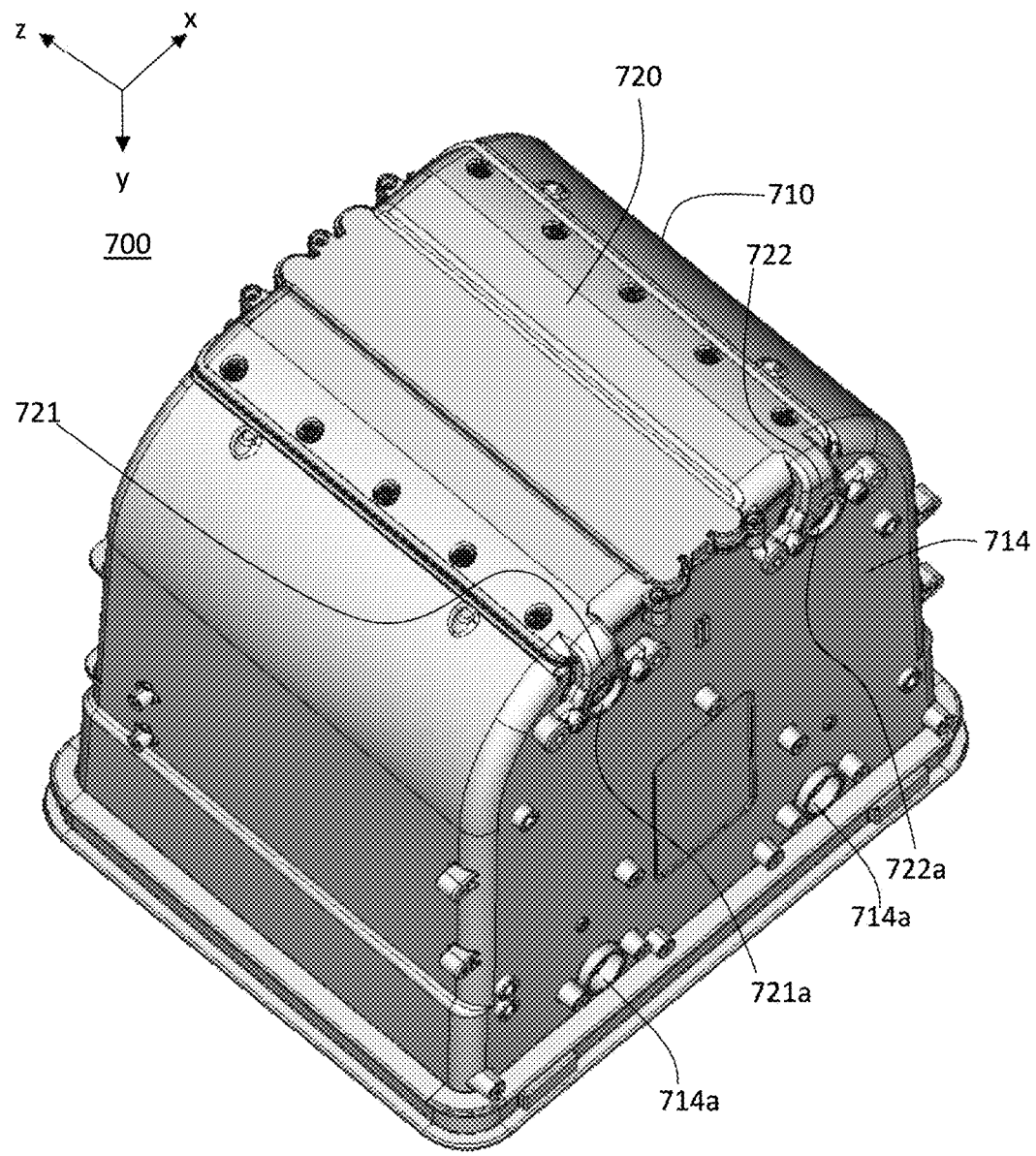
FIG. 7e illustrates an isometric view of a substrate container system in accordance with some embodiments of the instant disclosure.

FIG. 7e illustrates an isometric view of a substrate container system 700 in assembled configuration, in accordance with some embodiments of the instant disclosure. Up on assembly, the first/second gas inlet structure 721/722 of back cover 720 bendingly extends under the bottom face 714 of the container body 710 and covers the bended section (e.g., 141b) of the seal ring member, whereby the bended section (141b) is arranged between the bottom face 714 and the gas inlet structure 721 to ensure air-tightness around the gas intake port(s). Moreover, a pair of gas intake ports 721a, 722a open toward a downward direction (e.g., z-direction) opposing the bottom face 714.

Figure 8:
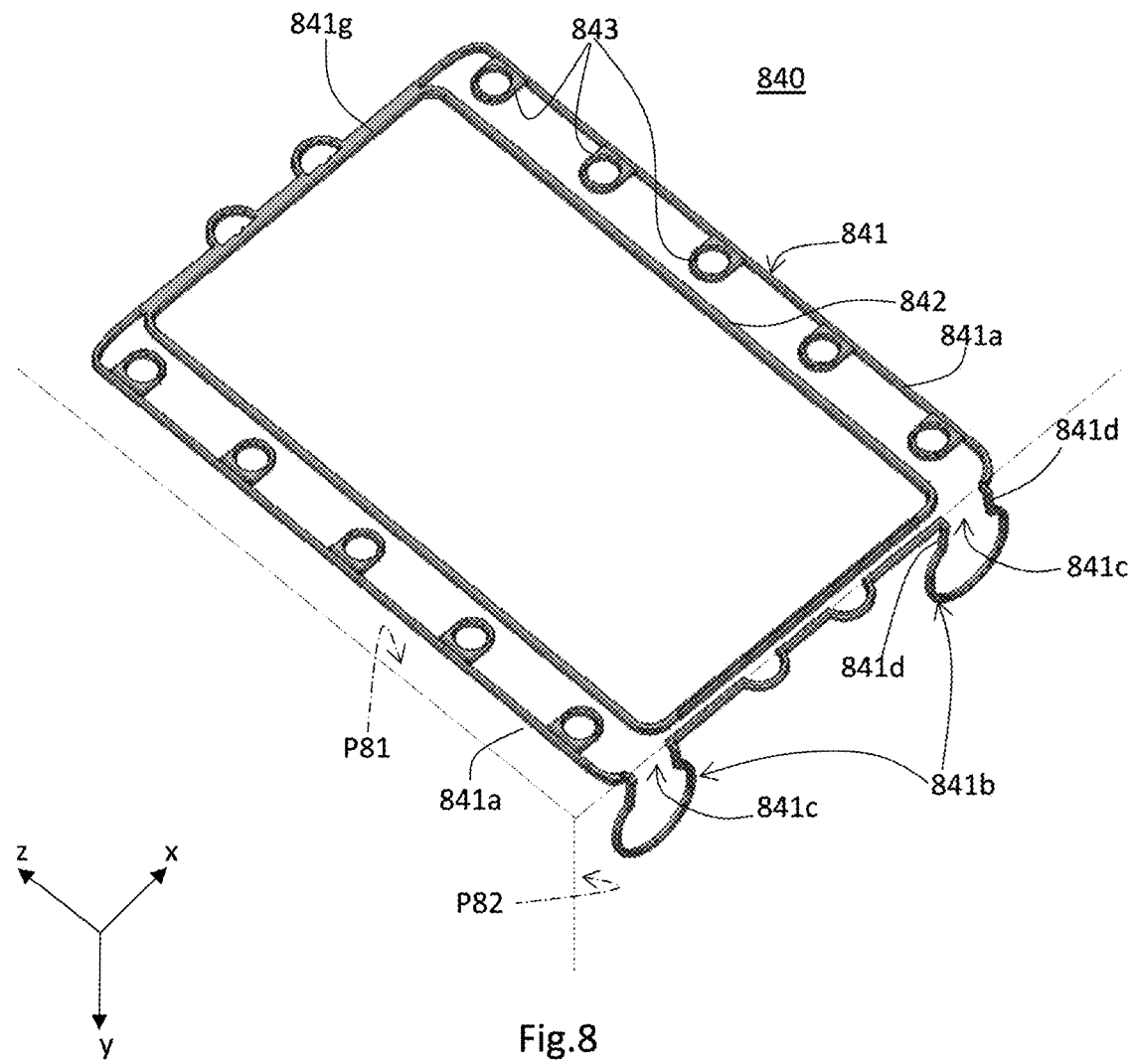
FIG. 8 illustrates an isometric view of a sealing member for a substrate container system in accordance with some embodiments of the instant disclosure.

FIG. 8 illustrates an isometric view of a sealing member 840 for the substrate container system in accordance with some embodiments of the instant disclosure. The exemplary sealing member 840 comprises a first (outer) seal ring portion 841, a second (inner) seal ring portion 842, and a plurality of third (auxiliary) seal ring portions 843. Moreover, the sealing member 840 is provided with an out-of-plane bending configuration.

In the illustrated example, a pair of substantially symmetrical main sections 841a of the first ring portion 841 (along with the shared subsection 841g) of the first ring portion 841 cooperatively defines a plane P81. The second (inner) ring portion 842, which is shown to extend substantially in the same plane P81, is generally enclosed within the periphery of the first (outer) ring portion 841. Meanwhile, the shared section 841g (of the outer ring portion) that extends along a width direction (e.g., along the x-axis direction) is where the inner and outer ring portions (e.g., first portion 841 and second portion 842) integrally join each other. Moreover, the first ring portion 841 includes a pair of substantially symmetrical out-of-plane (bended) sections 841b bendingly extend toward a substantially orthogonal plane P42 with respect to plane P41.

As shown in the exemplary embodiment, each one of the bended sections 841b includes two neck subsections 841d that are separately arranged along the width direction (e.g., x-axis direction) and respectively join the main section 841a at a substantially 90 degree bending angle. Between the pair of neck subsections 841d forms a gap 841c opposing the shared subsection 841g. The bended section 841b generally forms a loop that rests in plane P82 (substantially orthogonal with respect to plane P81), and is configured to surround and enclose a downward facing gas intake port (e.g., port 121a as previously depicted).

The third seal ring portions 843, which is arranged generally in-plane with the main sections 841a (i.e., resting substantially in plane P81), is integrally connected to the inner periphery of the first seal ring portion 841 and extend inwardly toward the second seal ring portion 842.

Figure 9A:
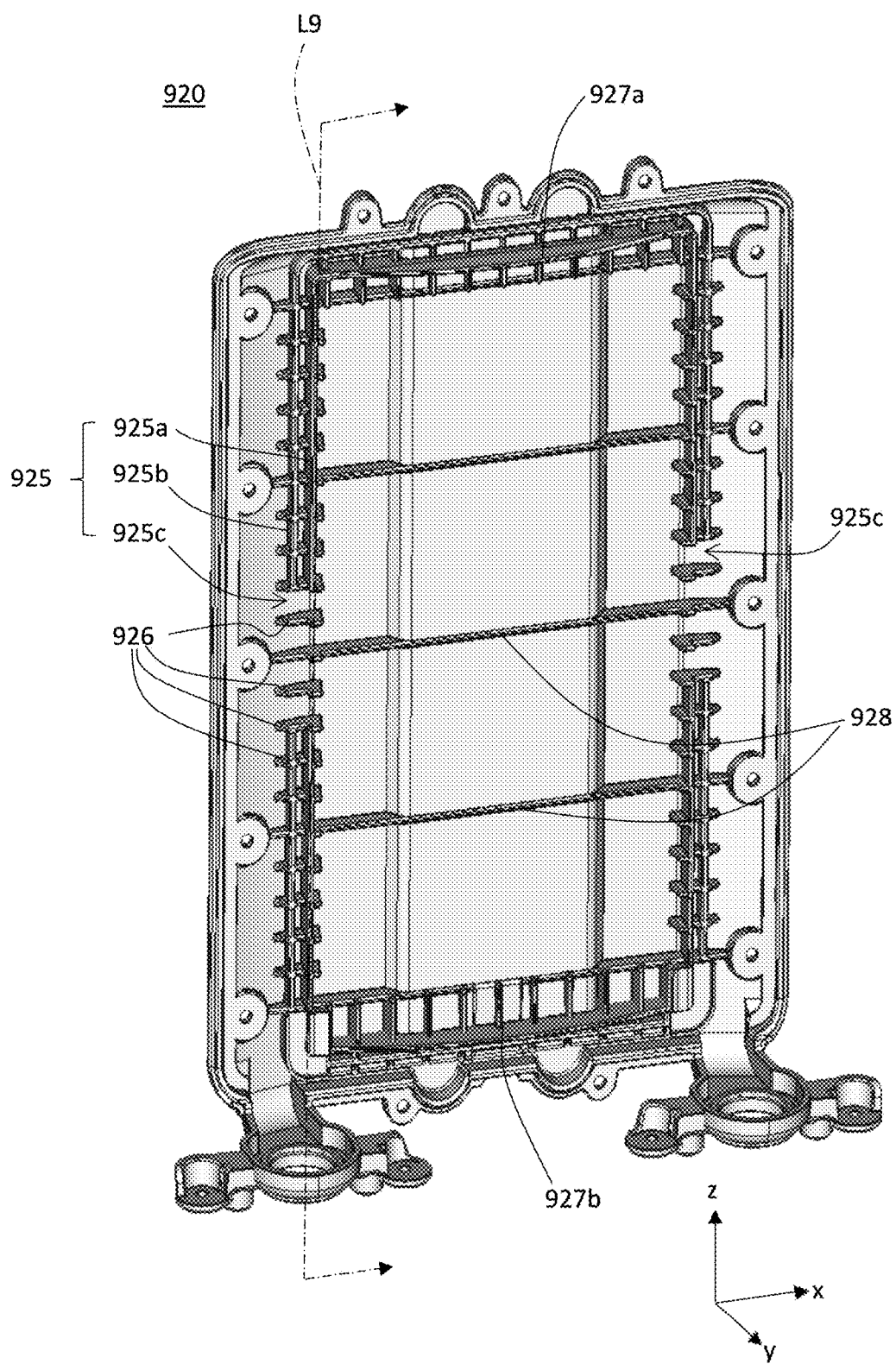
FIG. 9a illustrates an isometric view of a back cover for a substrate container system in accordance with some embodiments of the instant disclosure.

FIG. 9a illustrates an isometric view of an exemplary back cover for a substrate container system in accordance with some embodiments of the instant disclosure.

In some embodiments, back cover 920 comprises a pair of partition structures 925 extending along the height direction (e.g., along the z-axis) of the back cover 920. In some embodiments, an outlet (opening) 925c is formed in the partition structure 925. In some embodiments, the outlet 925c is arranged substantially in a middle section along the height of the back cover 920 (e.g., along the z-axis). In the illustrated embodiment, the two partition structures 925 are further connected to each other through an upper bridge partition structure 927a and a bottom bridge partition structure 927b.

In some embodiments, the partition structure (e.g., structures 925 or 927a/b) may include a plurality of generally concentric rib features. For instance illustrated partition structure 925 comprises a pair of generally concentrically arranged rib features 925a, 925b.

In addition, a plurality of ribs 928 extends along the width direction (e.g., along a x-axis shown in FIG. 9a) are further provided on the inner face 923 of the back cover 920 configured to enhance the structural integrity of the back cover 920. In some embodiments, the back cover 920 further includes a plurality of fins 926 arranged apart from each other and respectively intersect the rib features 925a/b of the partition structures 925.

In the illustrated embodiment, outlet 925c is divided by the fins 926 that are arranged normal to (e.g., along the width direction of the back cover) the partition structures 925. As such, the fins 926 may serve as air-guide and direct the gas passing through the outlet 925c toward the center of the back cover 920.

Figure 9B:
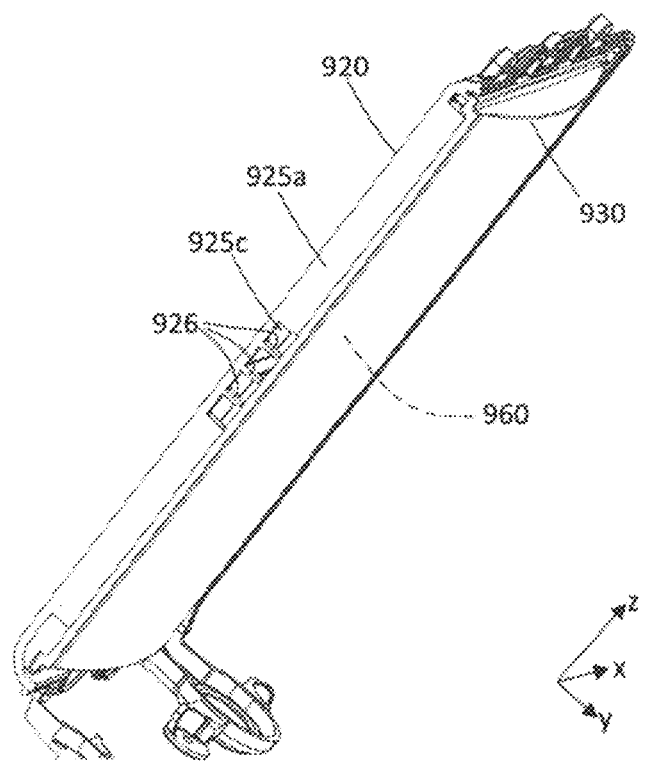
FIG. 9b illustrates a cut view of the back cover for a substrate container system in accordance with some embodiments of the instant disclosure.

FIG. 9b illustrates a cutaway section view (e.g., along cutline L9 shown in FIG. 9a) of a back cover being coupled to a filter member for a substrates container system in accordance with some embodiments of the instant disclosure.

In the illustrated embodiment, the rib feature 925a of the partition structure physically contacts the filter member 930 and defines a boundary of a gas component (obstructed from current view; indicated by the dotted line 960) between the back cover 920 and the filter member 930. In the illustrated embodiments, the outlet 925c is cooperatively defined by the rib feature 925a and the filter member 930. The outlet 925c is divided by the fins 926.

Figure 10:
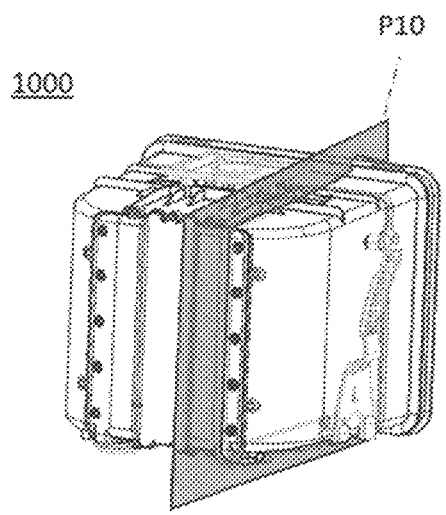
FIG. 10 illustrates a perspective view of a substrate container system in accordance with some embodiments of the instant disclosure.
Figure 11:
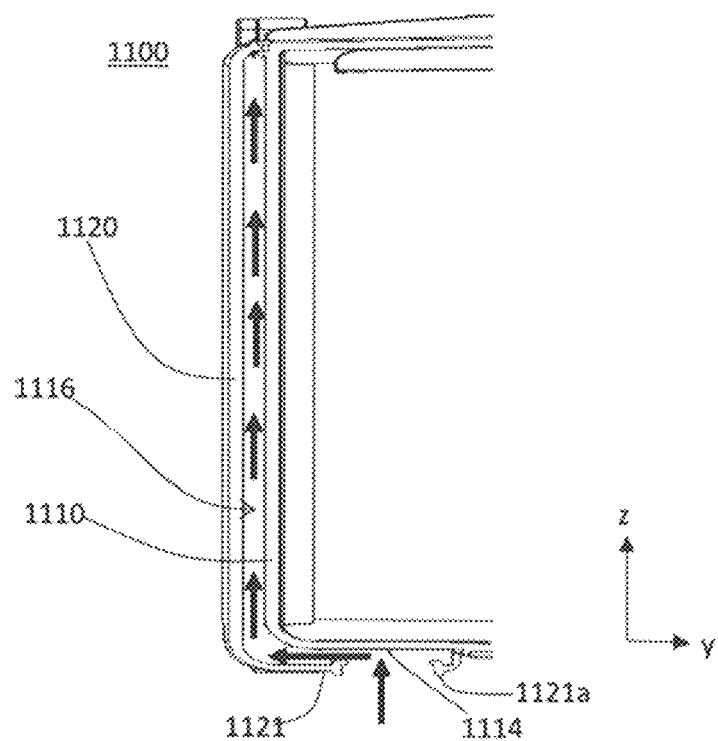
FIG. 11 illustrates a cross-sectional view of a substrate container system in accordance with some embodiments of the instant disclosure.

FIG. 10 illustrates a perspective view of an assembled substrate container system 1000 in accordance with some embodiments of the instant disclosure. FIG. 11 illustrates a cross-sectional regional view of an assembled substrate container system 1100 in accordance with some embodiments of the instant disclosure. FIG. 11 may be a cross-sectional view taken from a plane parallel to the plane P10 indicated in FIG. 10.

In the illustrated embodiment, the back cover 1120 and the container body 1110 cooperatively defines a gas guiding channel 1116 that extends along a height direction of the back cover. The gas inlet structure 1121 is connected to the gas guiding channel 1116. The gas guiding channel 1116 extends over the bottom face 1113 (e.g., along y-direction) of the container body 1110. Thus, when a purging apparatus (not shown) is connected to the gas intake port 1121a, the path of gas (e.g., indicated by the arrows shown in FIG. 11) released from the purging apparatus changes its direction inside the gas guiding channel 1116 (e.g., around the bottom face 1113 of the container body 1110 and the bendingly extending gas intake structure 1121 of the back cover 1120). In some embodiments, a second gas guiding channel with comparable arrangement may be provided on the back cover 1120. In some embodiments, the plurality of gas guiding channels may be arranged on the back cover of the container system in a substantially mirror symmetrical manner, e.g., as shown in FIG. 2 or 4.

Figure 12:
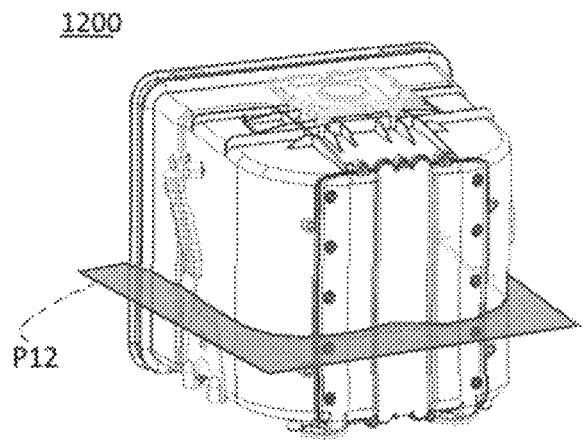
FIG. 12 illustrates a perspective view of a substrate container system in accordance with some embodiments of the instant disclosure.
Figure 13:
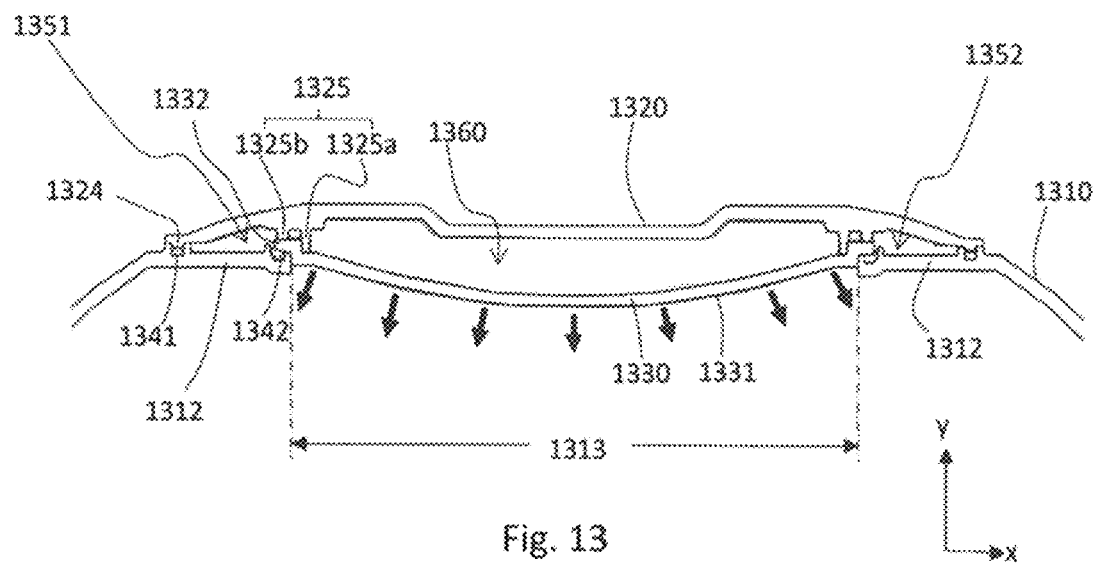
FIG. 13 illustrates a cross-sectional view of a substrate container system in accordance with some embodiments of the instant disclosure.

FIG. 12 illustrates a perspective view of a substrate container system 1200 in accordance with some embodiments of the instant disclosure. FIG. 13 illustrates a cross-sectional regional view of an assembled substrate container system in accordance with some embodiments of the instant disclosure. In some embodiments, the FIG. 13 may be a cross-sectional view taken from a plane parallel to the plane P12 indicated in FIG. 12.

In FIG. 13, the exemplary back cover 1320 is shown to be engaged with a container body 1310, thereby forming a sealing engagement between the filter member 1330 and the container body 1310. In the instant embodiment, the back cover 1320 is provided with a sealing lip 1324 at its periphery. The sealing lip 1324 is configured to establish physical contact with an outer sealing ring (e.g., first sealing ring portion 1341) arranged on the flange portions 1312 of a container body 1310. In the illustrated embodiment, a partition structure 1325 (e.g., outer rib 1325b) of the back cover 1320 is configured to exert pressing force on a filter member 1330 (e.g., along a frame 1332 of the filter member 1330) against an inner sealing ring 1342 (e.g., the inner seal ring portion) embedded on the container body 1310 (e.g., on the flange portions 1312). As such, sealing engagement between the container body 1310 and the filter member 1330 may be ensured.

Moreover, the partition structures 1325 (e.g., inner rib 1325a) of the back cover 1320 is shown to be in physical contact with the filter member 1330 thereby serving as a structural separation between the gas guiding channel 1351/1352 and the buffering compartment 1360. The buffering compartment 1360 is in fluid communication with the gas guiding channel 1351/1352 via outlets formed on the partition structures (e.g., outlets 925c has shown in FIG. 9). The structural profile and placement of the gas guiding channels 1351, 1352 are substantially symmetrical along a width direction of the back cover 1320 (e.g., x-direction indicated in FIG. 13). As such, the flow of purging gas may be symmetrically directed into the buffering compartment via the two outlets (e.g., outlet 926) during loading/unloading of the container interior.

A gas dispensing face 1331 of the filter member 1330 is configured to extend into the back opening 1313 defined between the flange portions 1312 of the container body 1310. For instance, the gas dispensing face 1331 is arranged toward the interior of the container body 1310, and reaches past the opening boundary defined by the fringe portions 1312. Accordingly, the gas dispensing surface 1331 has a surface area greater than the planar projection of the back opening 1313. As such, purging gas (indicated by the arrows shown in FIG. 13) may be released from the gas dispensing surface 1331 at a wider dispensing angle. In some embodiments, the gas dispensing face 1331 is provided with a curved cross-sectional profile (e.g., a parabolic) that extends toward the interior of the container body 1310.

Figure 14:
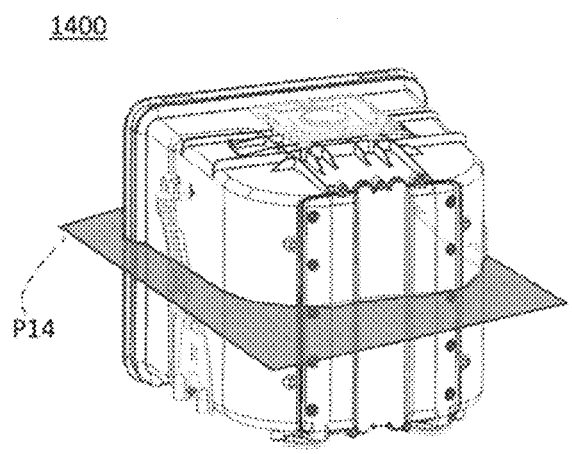
FIG. 14 illustrates a perspective view of a substrate container system in accordance with some embodiments of the instant disclosure.
Figure 15:
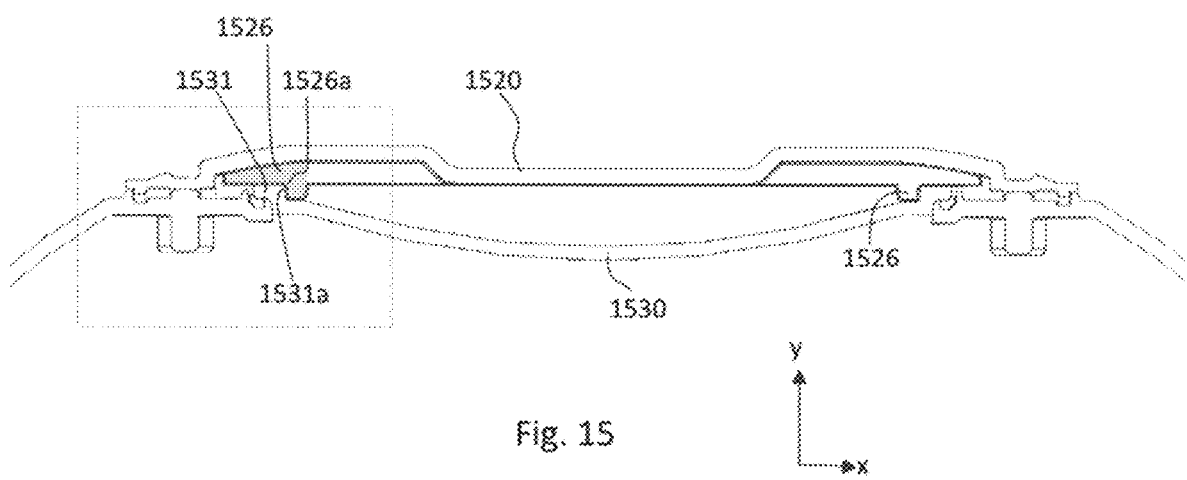
FIG. 15 illustrates a cross-sectional view of a substrate container system in accordance with some embodiments of the instant disclosure.

FIG. 14 illustrates a perspective view of a substrate container system 1400 in accordance with some embodiments of the instant disclosure. FIG. 15 illustrates a cross-sectional regional view of a substrate container system in accordance with some embodiments of the instant disclosure. In some embodiments, the FIG. 15 may be a cross-sectional view taken from a plane parallel to the plane P14 indicated in FIG. 14.

In some embodiments, a back cover of a container system may be further provided with a plurality of fins configured to retain a filter member received in the container system. For example, back cover 1520 is further provided with fin member 1526 (e.g., comparable to fins 926 depicted with respect to FIG. 9) that forms a L-shaped corner 1526a configured to establish urging contact with an inner edge 1531a of a frame 1531 of a filter member 1530, so as to laterally restrain the filter member 1530.

Figure 16:
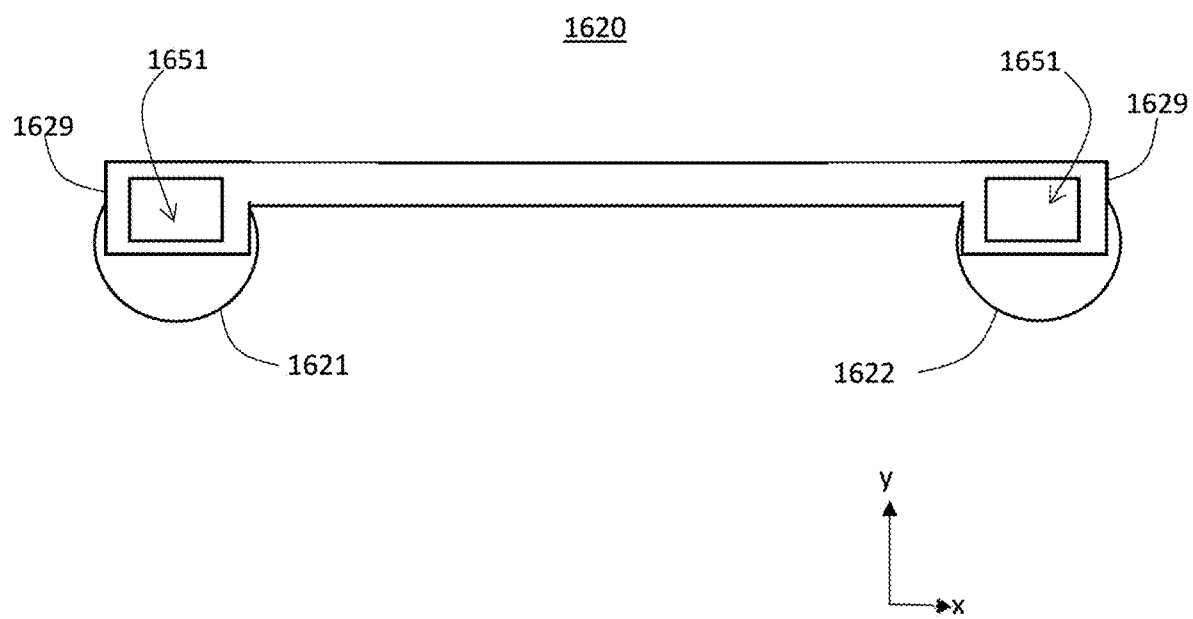
FIG. 16 illustrate a cross-sectional view of a back cover for the substrate container system in accordance with some embodiments of the instant disclosure.

FIG. 16 illustrates a cross-sectional view of an exemplary back cover for a substrate container system in accordance with some embodiments of the instant disclosure. In some embodiments, a back cover of a container system may incorporate a self-contained gas guiding channel. For example, the exemplary back cover 1620 comprises two tubular structures 1629, each of which forms a gas guiding channel 1651 in fluid connection with a gas intake structure 1621/1622, respectively.

Figure 17:
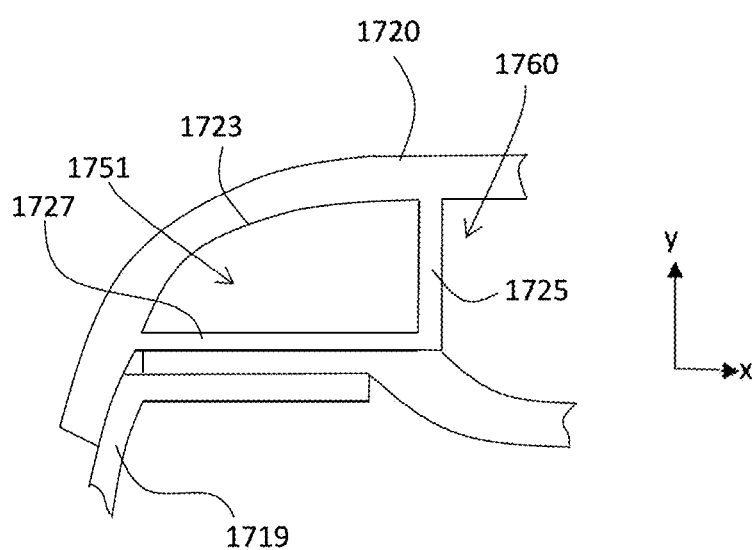
FIG. 17 illustrates a regional cross-sectional view of a substrate container system in accordance with some embodiments of the instant disclosure.

FIG. 17 illustrates a reginal cross section view of a substrate container system in accordance with some embodiments of the instant disclosure. For instance, FIG. 17 may be a regional enlarged sectional view in the dashed box shown in FIG. 15.

In the illustrated embodiment, back cover 1720 is further provided with a wall 1727 that extends away from the inner face 1723 of the back cover 1720 along a width direction (e.g. along a x-direction) of the back cover 1720, to the partition structure 1725. In the illustrated embodiment, the partition structure 1725, the wall 1727 and inner surface 1723 constitutes a tubular structure that forms the gas guiding channel 1751. In some embodiments, the back cover 1720 may be mounted with a side wall 1719 of the container body 1710, whereby a buffering compartment 1760 is formed beside the gas guiding channel 1751.

Figure 18:
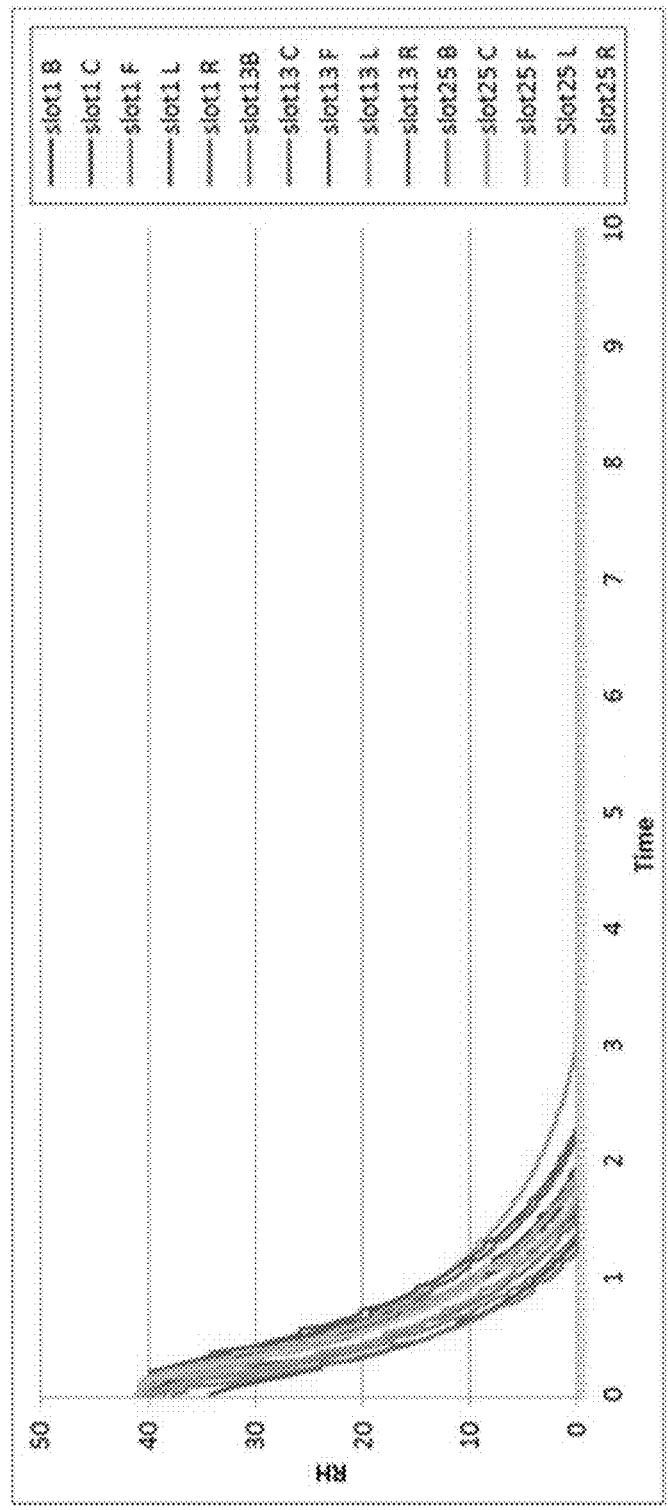
FIG. 18 illustrates data of an experiment using a substrate container system in accordance with some embodiments of the instant disclosure.

Referring to FIG. 18, which shows experimental data of internal humidity level versus time in a substrate container system as illustrated in FIG. 4.

Particularly, the container body is setup to receive twenty five substrates under continuous purging conditions for an illustrated time period of ten units (e.g., from zero to ten in the time axis). For purpose of the experiment, a plurality of testing substrates with onboard sensors (e.g., 3 in the instant illustration, respectively indicated by their loaded slots 1/13/25) are loaded into the container body. Each of the testing substrate is provided with 5 sensors arranged at different locations (e.g., indicated by labels B/C/F/L/R). The front door is then installed, thus sealing the front opening of the container system.

A purging process starts at time zero, during which one or more purging gas is provided to the interior of the container system (e.g., through gas port 221a). As a result, the internal humidity level of the container system is observed to drop noticeably during the initial period (e.g., dropped from about 40% to substantially 0 at around the $3^{rd}$ time unit mark).

Subsequently, the front door of the system that seals the front opening is removed in the middle of the time period (e.g., at the $5^{th}$ notch along the time axis). It was observed that proper placement of gas outlet (e.g., outlet 425c) in the gas guiding channel helps to prevent entrance of external gas from ambient environment into the container system, thereby ensuring/maintaining low moisture level in the container system even during loading/unloading process.

Accordingly, one aspect of the instant disclosure provides a substrate container system, which comprises a container body having a bottom face, a front opening that enables passage of a substrate, and a back opening opposing the front opening, the back opening having a width smaller than that of the front opening; and a back cover that covers the back opening and establishes sealing engagement with the container body, wherein the back cover comprises a first gas inlet structure that bendingly extends under the bottom face of the container body upon assembly; wherein the first gas inlet structure comprises a downward facing gas intake port opposing the bottom face of the container body.

In some embodiments of the instant disclosure, the back cover further comprises a second gas inlet structure, wherein the first and the second gas inlet structures are substantially symmetrically arranged along a width direction of the back cover.

In some embodiments of the instant disclosure, the container body is configured to receive a filter member that covers the back opening of the container body.

In some embodiments of the instant disclosure, each one of the first and the second gas inlet structure is connected to a gas guiding channel that extends along a height direction of the back cover.

In some embodiments of the instant disclosure, the gas guiding channel has an outlet arranged substantially in a middle section along the height of the back cover.

In some embodiments of the instant disclosure, the back cover and the filter member cooperatively define a buffering compartment connected to the gas guiding channel via the outlet.

In some embodiments of the instant disclosure, the back cover comprises a pair of partition structures respectively adjacent the back opening in the width direction, extending along the height direction; wherein the outlet of the gas guiding channel is formed in the partition structure.

In some embodiments of the instant disclosure, the container body further comprises a pair of flange portions arranged opposing the front opening and respectively adjacent the back opening along a width direction; wherein the back cover at least partially overlaps the pair of flange portions, wherein the gas guiding channel is formed in an overlapped region between the back cover and the flange portions of the container body.

In some embodiments of the instant disclosure, the system further comprises a filter member having a gas dispensing surface that extends toward the container body through the back opening.

In some embodiments of the instant disclosure, the system further comprises a sealing member having a first seal ring portion arranged between the back cover and the container body, wherein the first seal ring portion comprises a section that bendingly extends between the bottom face of the container body and the gas inlet structures.

In some embodiments of the instant disclosure, the sealing member further comprises a second seal ring portion arranged between the filter and the container body, wherein the first and the second seal ring portions are integrally connected.

Accordingly, one aspect of the instant disclosure provides a substrate container system, which comprises a container body having a bottom face, a front opening that enables passage of a substrate, and a back opening opposing the front opening, wherein the container body is configured to receive a filter member that covers the back opening of the container body; a back cover that establishes sealing engagement with the container body; wherein the back cover and the filter member cooperatively defines a buffering compartment; and a first gas guiding channel that extends along a height direction of the back cover; wherein the first gas guiding channel has an outlet connected to the buffering compartment.

In some embodiments of the instant disclosure, the outlet is arranged substantially in a middle section along the height of the back cover.

In some embodiments of the instant disclosure, the back cover comprises a pair of partition structures respectively adjacent the back opening in the width direction, extending along the height direction; wherein the outlet of the first gas guiding channel is formed in the partition structure.

In some embodiments of the instant disclosure, the container body further comprises a pair of flange portions arranged opposing the front opening and respectively adjacent the back opening along a width direction; wherein the back cover at least partially overlaps the pair of flange portions, wherein the first gas guiding channel is formed in an overlapped region between the back cover and the flange portions of the container body.

In some embodiments of the instant disclosure, the system further comprises a second gas guiding channel, wherein the first and the second gas guiding channels are substantially symmetrically arranged along a width direction of the back cover.

In some embodiments of the instant disclosure, the back cover further comprises a first gas inlet structure that bendingly extends under the bottom face of the container body upon assembly; and wherein the first gas inlet structure connects the first gas guiding channel and comprises a downward facing gas intake port opposing the bottom face of the container body.

In some embodiments of the instant disclosure, the system further comprises a filter member having a gas dispensing surface, wherein a surface area of the gas dispensing surface is greater than that of the back opening.

In some embodiments of the instant disclosure, the system further comprises a sealing member having a first seal ring portion arranged between the back cover and the container body, wherein the first seal ring portion comprises a section that bendingly extends between the bottom face of the container body and the first gas inlet structures.

In some embodiments of the instant disclosure, the sealing member further comprises a second seal ring portion arranged between the filter and the container body, wherein the first and the second seal ring portions are integrally connected.

The embodiments shown and described above are only examples. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A substrate container system, comprising:
a container body having a bottom face, a front opening that enables passage of a substrate, and a back opening opposing the front opening, the back opening having a width smaller than that of the front opening; and
a back cover that covers the back opening and establishes sealing engagement with the container body, wherein:
the back cover comprises a first gas inlet structure that bendingly extends under the bottom face of the container body upon assembly, and
the first gas inlet structure comprises a downward facing gas intake port opposing the bottom face of the container body.

2. The substrate container system of claim 1, wherein:
the back cover further comprises a second gas inlet structure, and the first gas inlet structure and the second gas inlet structure are substantially symmetrically arranged along a width direction of the back cover.

3. The substrate container system of claim 2, wherein the first gas inlet structure and the second gas inlet structure are connected to a gas guiding channel that extends along a height direction of the back cover.

4. The substrate container system of claim 3, wherein the gas guiding channel has an outlet arranged substantially in a middle section along the height direction of the back cover.

5. The substrate container system of claim 4, wherein the back cover and the filter member cooperatively define a buffering compartment connected to the gas guiding channel via the outlet.

6. The substrate container system of claim 4, wherein:
the back cover comprises a pair of partition structures respectively adjacent the back opening in the width direction of the back cover and extending along the height direction of the back cover, and
the outlet of the gas guiding channel is formed in the partition structure.

7. The substrate container system of claim 6, wherein:
the container body further comprises a pair of flange portions arranged opposing the front opening and respectively adjacent the back opening along the width direction of the back cover, and
the back cover at least partially overlaps the pair of flange portions, wherein the gas guiding channel is formed in an overlapped region between the back cover and the pair of flange portions of the container body.

8. The substrate container system of claim 1, wherein the container body is configured to receive a filter member that covers the back opening of the container body.

9. The substrate container system of claim 8, further comprising the filter member, the filter member having a gas dispensing surface that extends toward the container body through the back opening.

10. The substrate container system of claim 8, further comprising a sealing member having a first seal ring portion arranged between the back cover and the container body, wherein the first seal ring portion comprises a section that bendingly extends between the bottom face of the container body and both the first gas inlet structure and the second gas inlet structure.

11. The substrate container system of claim 10, wherein the sealing member further comprises a second seal ring portion arranged between the filter member and the container body.

12. A substrate container system, comprising:
a container body having a bottom face, a front opening that enables passage of a substrate, and a back opening opposing the front opening;
a back cover that establishes sealing engagement with the container body; and
a first gas guiding channel that extends along a height direction of the back cover wherein:
the container body is configured to receive a filter member that covers the back opening of the container body,
the back cover and the filter member cooperatively define a buffering compartment, and
the first gas guiding channel has an outlet connected to the buffering compartment.

13. The substrate container system of claim 12, wherein the outlet is arranged substantially in a middle section along the height direction of the back cover.

14. The substrate container system of claim 12, wherein:
the back cover comprises a pair of partition structures respectively adjacent the back opening in a width direction of the back cover and extending along the height direction of the back cover, and
the outlet of the first gas guiding channel is formed in the partition structure.

15. The substrate container system of claim 12, wherein:
the container body further comprises a pair of flange portions arranged opposing the front opening and respectively adjacent the back opening along a width direction of the back cover,
the back cover at least partially overlaps the pair of flange portions of the container body, and
the first gas guiding channel is formed in an overlapped region between the back cover and the pair of flange portions of the container body.

16. The substrate container system of claim 12, further comprising a second gas guiding channel, wherein the first gas guiding channel and the second gas guiding channel are substantially symmetrically arranged along a width direction of the back cover.

17. The substrate container system of claim 12, wherein:
the back cover further comprises a first gas inlet structure that bendingly extends under the bottom face of the container body upon assembly, and
the gas inlet structure connects to the first gas guiding channel and comprises a downward facing gas intake port opposing the bottom face of the container body.

18. The substrate container system of claim 17, further comprising a sealing member having a first seal ring portion arranged between the back cover and the container body, wherein the first seal ring portion comprises a section that bendingly extends between the bottom face of the container body and the gas inlet structure.

19. The substrate container system of claim 18, wherein the sealing member further comprises a second seal ring portion arranged between the filter member and the container body.

20. The substrate container system of claim 12, further comprising the filter member, the filter member having a gas dispensing surface, wherein a surface area of the gas dispensing surface is greater than that of the back opening.

* * * * *